(12) United States Patent
Kong et al.

(10) Patent No.: US 7,098,501 B2
(45) Date of Patent: Aug. 29, 2006

(54) THIN CAPACITIVE STRUCTURE

(75) Inventors: Weiran Kong, Sunnyvale, CA (US);
Bernard Ho, Fremont, CA (US); David Greenhill, Portola Valley, CA (US);
Sudhakar Bobba, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 160 days.

(21) Appl. No.: 10/360,267

(22) Filed: Feb. 5, 2003

(65) Prior Publication Data

US 2004/0150026 A1 Aug. 5, 2004

(51) Int. Cl.
*H01L 27/108* (2006.01)
*H01L 29/76* (2006.01)
*H01L 29/94* (2006.01)

(52) U.S. Cl. ........................ 257/306; 257/758
(58) Field of Classification Search ........ 257/300–313, 257/758; 438/239–256
See application file for complete search history.

(56) References Cited

U.S. PATENT DOCUMENTS 6,147,857 A * 11/2000 Worley et al. ........... 361/301.2
2002/0025623 A1 * 2/2002 Yamamichi et al. ........ 438/239
2003/0001284 A1 * 1/2003 List et al. .................... 257/778
2003/0062564 A1 * 4/2003 Kobayashi et al. ......... 257/306
2004/0183209 A1 * 9/2004 Lin ............................. 257/778

FOREIGN PATENT DOCUMENTS

TW 494559 * 7/2002

* cited by examiner

*Primary Examiner*—Zandra V. Smith
*Assistant Examiner*—Monica Lewis
(74) *Attorney, Agent, or Firm*—Martine Penilla & Gencarella, LLP.

(57) ABSTRACT

A capacitor structure in a semiconductor device is provided. The capacitor structure includes a first power rail on a topmost level of the semiconductor device, and a second power rail on the topmost level of the semiconductor device. The capacitor structure also includes a dielectric layer disposed over at least a portion of one of the first power rail and the second power rail. The capacitor structure further includes a conductive layer disposed over and between the first power rail and the second power rail where the conductive layer is in electrical contact with the power rail not having the dielectric layer, and the conductive layer is disposed over the dielectric layer.

10 Claims, 9 Drawing Sheets

THIN CAPACITIVE STRUCTURE

BACKGROUND OF THE INVENTION

1. Field of the Invention

The present invention relates to semiconductor chips, and more particularly, to the formation of capacitors within a semiconductor device.

2. Description of the Related Art

In today's high powered computing world, many processors' frequencies are in the gigahertz (GHz) range. Consequently, capacitors are often required to shunt high frequency and high current AC components that are inevitably coupled onto system power buslines. These capacitors, typically named de-coupling capacitors, are integrated either on-die (adds wafer cost) or on-package (adds package cost). Therefore, large costs may be associated with the usage of capacitors when using either of the above methods.

Capacitors can be utilized in a cost effective manner when used at the wafer level. Unfortunately, this method also has other problems. The common approach to capacitor usage on the wafer level is to build the de-coupling capacitor at lower metal levels such as, for example, M1–M3. This involves using at least 2 layers of metal and therefore requires a via to make the connection from a top metal line to a top capacitor plate located over the dielectric of the capacitor and the bottom capacitor plate. This kind of approach is useful if a small amount of capacitance is needed. Unfortunately, when large amounts of capacitance are desired, this approach becomes problematical because the aforementioned capacitor structures do not have large capacitance plates due to limited space in the lower levels of the semiconductor structure. In addition, the prior art method requires usage of dedicated space within the semiconductor structure taking away valuable space that could be used for other semiconductor structures.

Figure 1:
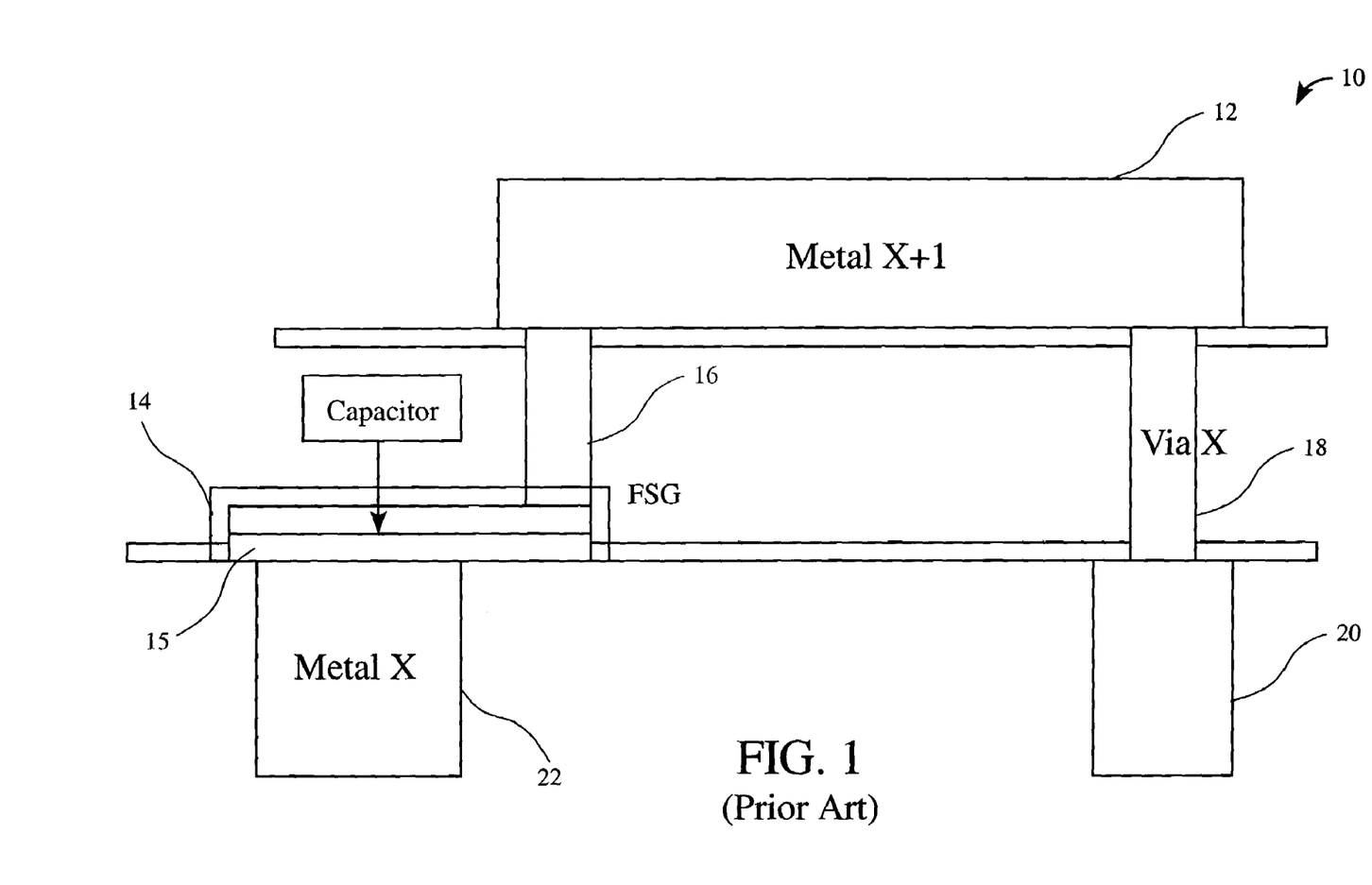
FIG. 1 shows a typical prior art semiconductor structure.

FIG. 1 shows a typical prior art semiconductor structure 10. The semiconductor structure 10 includes a metal line 12 connected to a top capacitor plate 14 and connected to metal lines 22 and 20 at a lower metallization level by use of vias 16 and 18 respectively. In one typical example, the via 16 from the metal line 12 is connected to the top capacitor plate 14. The top capacitor plate 14 is separated from the metal line 22 by a dielectric layer 15. Unfortunately, the structure 10 defined by the top capacitor plate 14, the dielectric layer 15 and the metal line 16 can only produce a small amount of capacitance and in addition takes up dedicated space within the semiconductor device.

In view of the foregoing, there is a need for capacitors that do not occupy dedicated space within the semiconductor device and can generate larger amounts of capacitance than the prior art structures.

SUMMARY OF THE INVENTION

A capacitor structure in a semiconductor device is provided. The capacitor structure includes a first power rail on a topmost level of the semiconductor device, and a second power rail on the topmost level of the semiconductor device. The capacitor structure also includes a dielectric layer disposed over at least a portion of one of the first power rail and the second power rail. The capacitor structure further includes a conductive layer disposed over and between the first power rail and the second power rail where the conductive layer is in electrical contact with the power rail not having the dielectric layer, and the conductive layer is disposed over the dielectric layer.

A method for generating a capacitor structure is provided which includes identifying a first power rail and a second power rail on a topmost level of a semiconductor device, and disposing a dielectric layer over at least a portion of one of the first power rail and the second power rail. The method also includes disposing a conductive layer over and between the first power rail and the second power rail where the conductive layer is in electrical contact with the power rail not having the dielectric layer, and the conductive layer is disposed over the dielectric layer.

A capacitor structure in a semiconductor device is disclosed which includes a first power rail, a second power rail, and a dielectric layer defined over the first power rail. The capacitor structure further includes a conductive layer defined over at least a portion of the second power rail and over at least a portion of the dielectric layer where the dielectric layer is disposed between the conductive layer and the first power rail, and the conductive layer is oriented perpendicular to the first power rail and the second power rail. The conductive layer is a top plate of the capacitor, the dielectric layer is a dielectric of the capacitor, and the second power rail is a bottom plate of the capacitor where the conductive layer is defined over a topmost level in a semiconductor device.

The advantages of the present invention are numerous. Most notably by enabling generation of capacitive structures that do not occupy dedicated metallization line space, more space may be utilized for other performance enhancing features within the semiconductor chip. Specifically, the present invention enables space optimizing capacitance by using a dielectric layer and a conductive layer on a topmost level of the semiconductor device. The conductive layer can be placed between the first power rail and the power rail and may be in electrical contact with the power rail not having the dielectric layer. The conductive layer is also located over the dielectric layer. In addition, the capacitor of the present invention is thin and does not take up multiple metallization levels. As a result, the present invention does not require additional space in the lower metallization levels of the semiconductor device and in addition does not need vias for capacitor formation. Consequently, the capacitor of the present invention enables chip designers and producers to generate semiconductor devices with capacitors that may be packaged in an efficient and cost effect manner.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is disclosed for semiconductor architectures having space saving capacitor structures. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figures 2A, 2B:
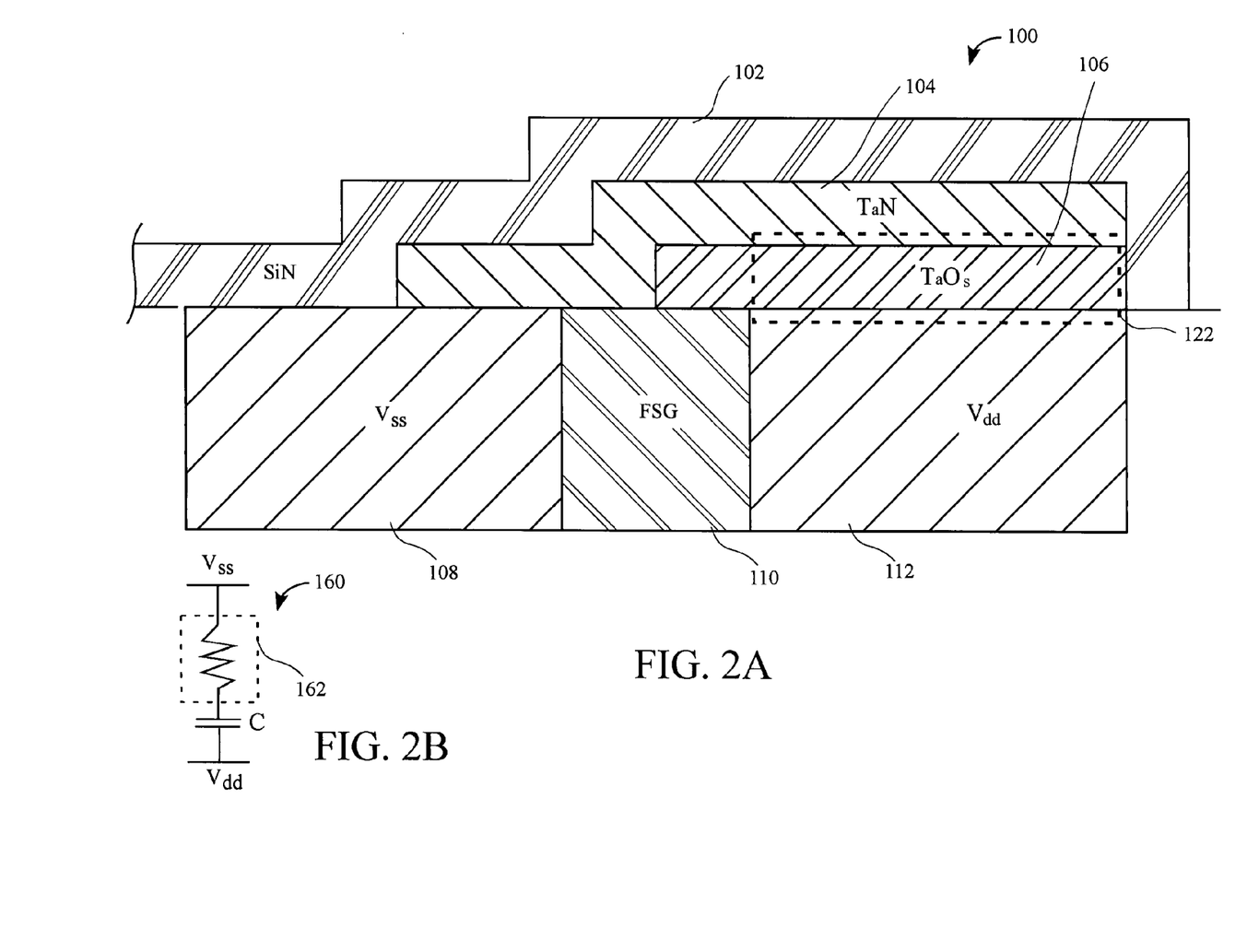
FIG. 2A illustrates a cross sectional view of a capacitor structure in accordance with one embodiment of the present invention.
FIG. 2B illustrates an electrical diagram illustrating the functionality of the capacitor structure in accordance with one embodiment of the present invention.

FIG. 2A illustrates a cross sectional view of a capacitor structure 100 in accordance with one embodiment of the present invention. It should be appreciated that the capacitor structure 100 shown is one of many suitable embodiments that may be utilized to generate high levels of capacitance without using excess semiconductor space. In one embodiment, the capacitor structure 100 includes a conductive layer 104, a dielectric layer 106, a power rail 108, and a power rail 112. In one particular embodiment, the power rail 108 may be a ground (Vss) while the power rail 112 may be a power (Vdd). In another embodiment, the power rail 108 may be the power (Vdd) and the power rail 112 may be the ground (Vss).

The conductive layer 104 is disposed over and electrically connected with the power rail 108 and extends to a region over the dielectric layer 106. The dielectric layer 106 is defined over the power rail 112 so the conductive layer 104 does not come into direct electrical contact with the power rail 112. A dielectric material 110 may be located between the power rail 108 and the power rail 112 to electrically separate the power rail 108 from the power rail 112. Therefore, as shown in the structure 100, the conductive layer 104 is capable of applying electrical charge from the power rail 108 to a region over the power rail 112. In such an embodiment, the conductive layer 104 is a top plate of a capacitor 122, the dielectric layer 106 is the dielectric of the capacitor 122, and the power rail 112 is a bottom plate of the capacitor 122. In this type of configuration, the conductive layer 104 may be defined over a topmost level of the semiconductor device as discussed in reference to FIG. 3A thereby not interfering with the internal structure of the semiconductor device. Therefore, space that would typically be utilized for capacitors in the lower levels of the semiconductor chip may be utilized for other types of desired semiconductor structures. In such a manner, decoupling capacitors may be generated in a space efficient way. Therefore, electrical coupling of voltage levels and signals generated by power rails may be reduced without taking up large amounts of dedicated space in the lower metal levels.

In one embodiment, the power rail 108 and the power rail 112 are conductors that can carry an electrical signal or charge. The conductor used for the power rail 108 and power rail 112 may be any suitable type of material that can carry electrical charges such as, for example, copper, aluminum, tungsten, silver, etc.

The dielectric layer 106 may be made from any suitable type of material that may prevent direct electrical contact between the conductive layer 104 and the power rail 112. In one embodiment, the dielectric 106 is tantalum oxide ($Ta_2O_5$). In other embodiments, the dielectric layer 106 may be made from materials such as, for example, $SiO_2$, $Si_3N_4$, etc.

The dielectric 110 may be made from any suitable type of material that may prevent direct electrical contact between the power rail 108 and the power rail 112. In one embodiment, the dielectric 110 is fluorosilicate glass (FSG). In other embodiments, the dielectric layer 110 may be made from materials such as, for example, $SiO_2$, or carbon doped low-k material.

It should be appreciated that the conductive layer 104 may have any suitable amount of resistance. In certain embodiments, it may be preferable for the conductive layer 104 to have some resistance to prevent electrical leaks. In one embodiment, the conductive layer 104 may have a resistance of between about 10 $\Omega$/ to about 104 $\Omega$/. This resistance can provide a current limiter to reduce or prevent electrical leaks that could occur if a defect occurs in the generation of the semiconductor structure 100. Depending on the type of material utilized for the conductive layer 104, the resistance can be adjusted for the desired application.

As shown in FIG. 2A, a passivation layer 102 is disposed directly over the topmost level of the structure 100. In one embodiment, the passivation layer 102 is a silicon nitride ($Si_3N_4$) material, but it should be appreciated that any other suitable type of material such as, for example, $SiO_2$ or a combination of $Si_3N_4$ and $SiO_2$, etc. may be used to protect the capacitor structure 100. Therefore, flat top level capacitors can be made on the topmost level of the semiconductor chip thereby enabling generation of decoupling capacitance without using space in lower level metallization levels.

It should be appreciated that the structure 100 as shown in FIG. 2A may be generated using any suitable photolithographic, etching, and semiconductor processing techniques as known by those skilled in the art. In one embodiment, the processes such as that discussed below in reference to FIGS. 4, 5, and 6 may be utilized to generate the capacitors on the topmost level of the semiconductor chip.

FIG. 2B illustrates an electrical diagram 160 illustrating the functionality of the capacitor structure 100 in accordance with one embodiment of the present invention. In this embodiment, the diagram 160 shows a ground (Vss) such as, for example, the power rail 108, being connected to a resistor 162 which is in turn connected to a capacitor. The capacitor is also connected with a power (Vdd) such as, for, example, the power rail 112. Through electrical charges generated at the Vss and the Vdd, capacitance may be generated. The capacitance may be created through use of, for example, the capacitor 122 as discussed in reference to FIG. 2A. The material of the conductive layer 104 such as discussed in reference to FIG. 2A may act as a current limiter thereby providing the resistor 162 as indicated by the diagram 160. This resistance may therefore provide protection for current leaks that may occur between the conductive layer 104 and the power rail 112 if there is a defect (e.g., a hole) in the dielectric layer 106.

Figure 2C:
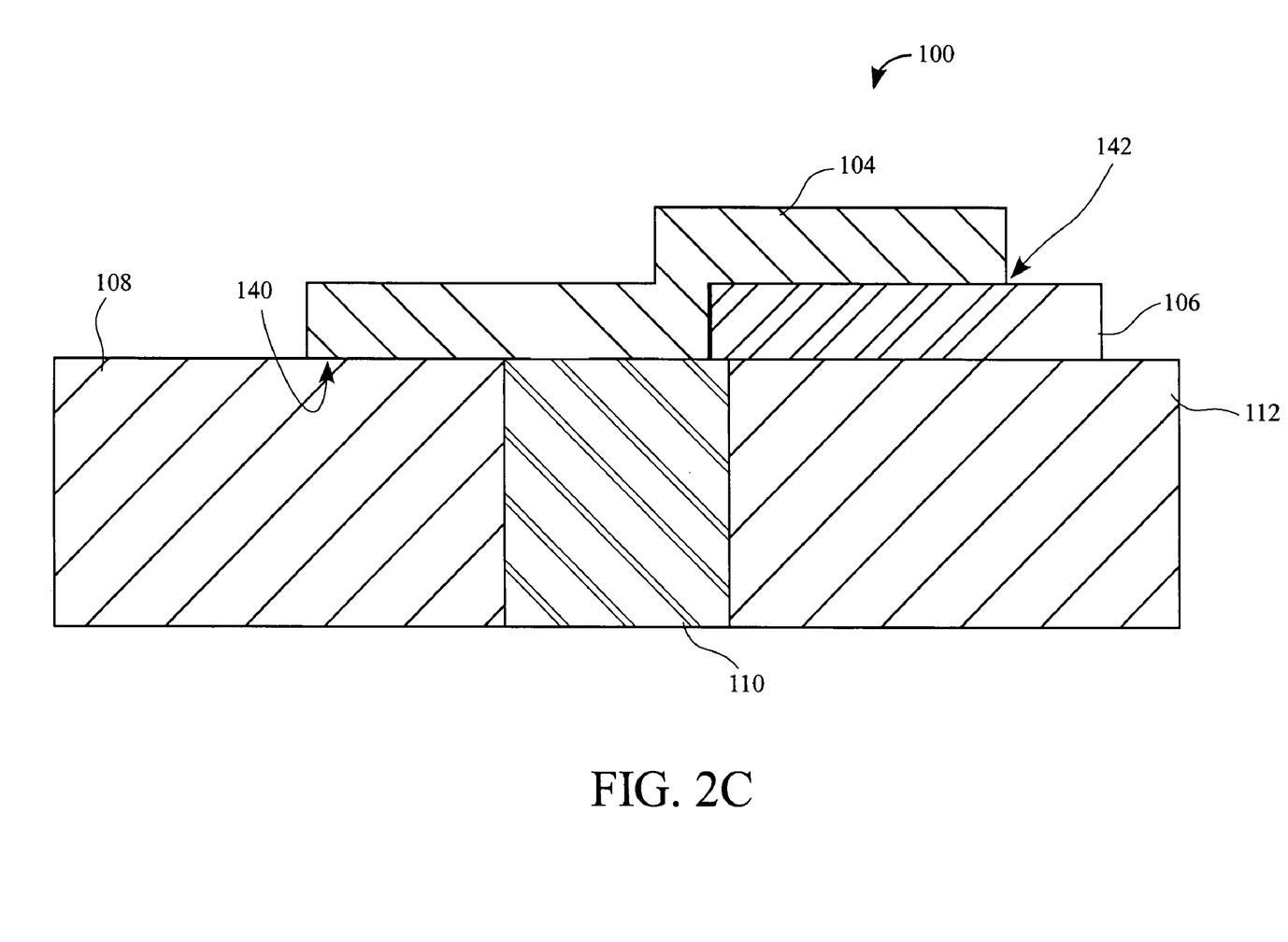
FIG. 2C shows a cross sectional view of a capacitor structure without a passivation layer in accordance with one embodiment of the present invention.

FIG. 2C shows a cross sectional view of a capacitor structure 100 shown without a passivation layer in accordance with one embodiment of the present invention. In one embodiment, the structure 100 includes the power rail 108 and the power rail 112 located on a top most level of a semiconductor device. The power rails 108 and 112 are separated by the dielectric 110. The dielectric layer 106 is located at least over a portion of the power rail 112. The conductive layer 104 is located over and between the power rails 108 and 112. The conductive layer 104 is in direct contact with the power rail 108 as shown by location 140 in one section of the structure 100 while also being located over the dielectric layer 106 in another section of the structure 100. The conductive layer 104 is disposed over the dielectric layer 106 so as to not directly contact the power rail 112 as shown by location 142. Therefore, a capacitor may be generated by applying an electrical charge from the power rail 108 to a portion of the conductive layer 104 over the dielectric layer 106 while also applying a charge to the power rail 112.

In one embodiment, a height (vertical axis of the structure 100 as shown in FIG. 2C) of the dielectric 106 is between about 50 A to about 300 A. In another embodiment, the height of the dielectric 106 is between about 100 A and about 250 A, and in yet another embodiment the height of the dielectric 106 is about 150 A.

The conductive layer 104 may be any suitable material that can carry electrical charges or signals. In one embodiment, the conductive layer 104 is made from TaN. In other embodiments, the conductive layer 104 may be made from TiN, Al, In, etc. In one embodiment, a height of the conductive layer 104 is between about 100 Angstroms (A) and about 1000 A, and in another embodiment, the height of the conductive layer 104 is between about 200 A and about 500 A, and in yet another embodiment, the height of the conductive layer 104 is about 300 A. The dimensions described in reference to FIG. 2C may also apply to other embodiments of the capacitance structure described herein. Consequently, because the conductive layer 104 and the dielectric layer 106 is extremely thin, the capacitor structure 100 is substantially flat and does not take up more than one level (in this case the topmost level) of the semiconductor chip.

Figure 3A:
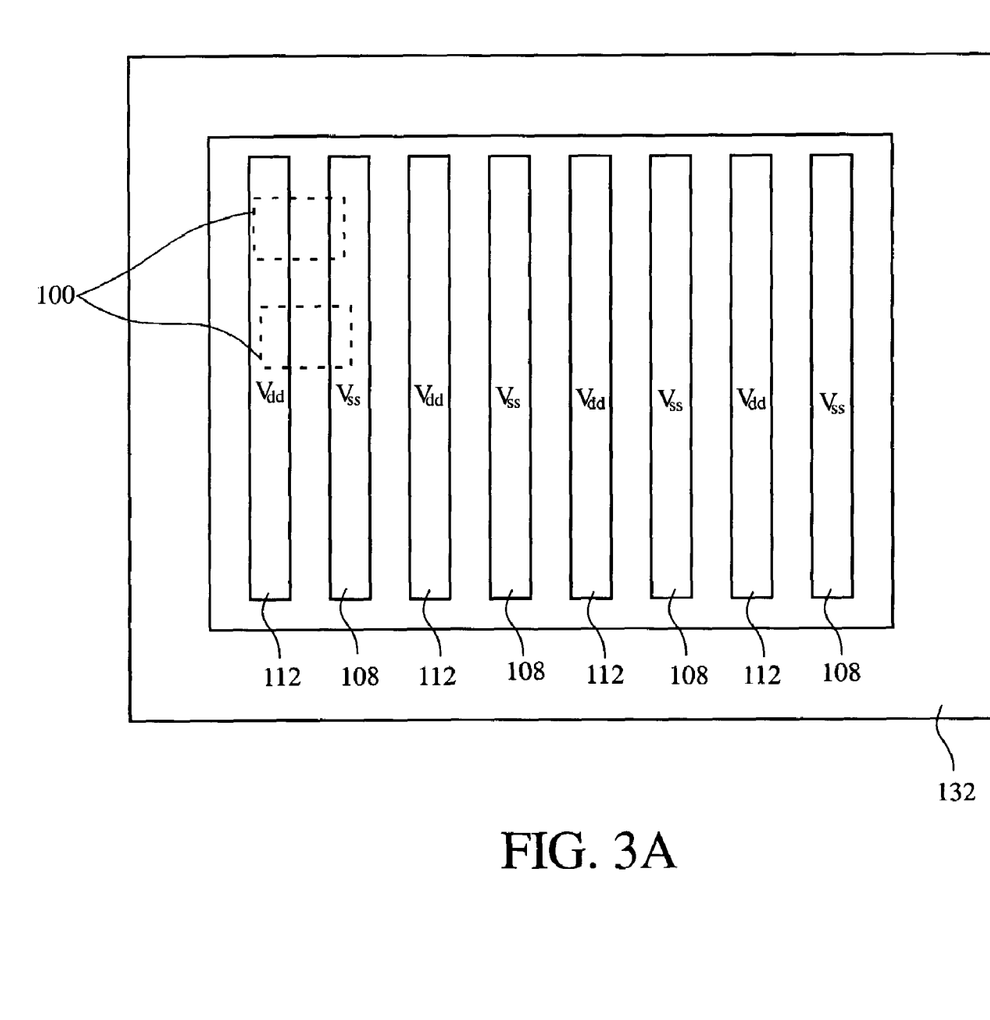
FIG. 3A shows a top view of a semiconductor device illustrating locations where the capacitive structures may be utilized in accordance with one embodiment of the present invention.

FIG. 3A shows a top view of a semiconductor device 132 illustrating locations where the capacitive structures 100 may be utilized in accordance with one embodiment of the present invention. The top view shows the structure of the semiconductor device 132 below the passivation layer 102. It should be appreciated that depending on the power needs of the semiconductor device 132, any suitable number of power rails 108 and 112 may be utilized. In one embodiment, the semiconductor device 132 includes power rails 108 and power rails 112 in a topmost section of the semiconductor device 132. In such an embodiment as shown in FIG. 3A, the capacitance structures 100 may be utilized over the power rails 112 and 108. Therefore, capacitance may be generated without usage of vias and without usage of precious space between the lower metal lines of different metallization layers. As discussed in referenced to FIGS. 3B and 3C, any suitable number and size of capacitors may be utilized depending on the capacitance needs in a particular semiconductor device.

Figure 3B:
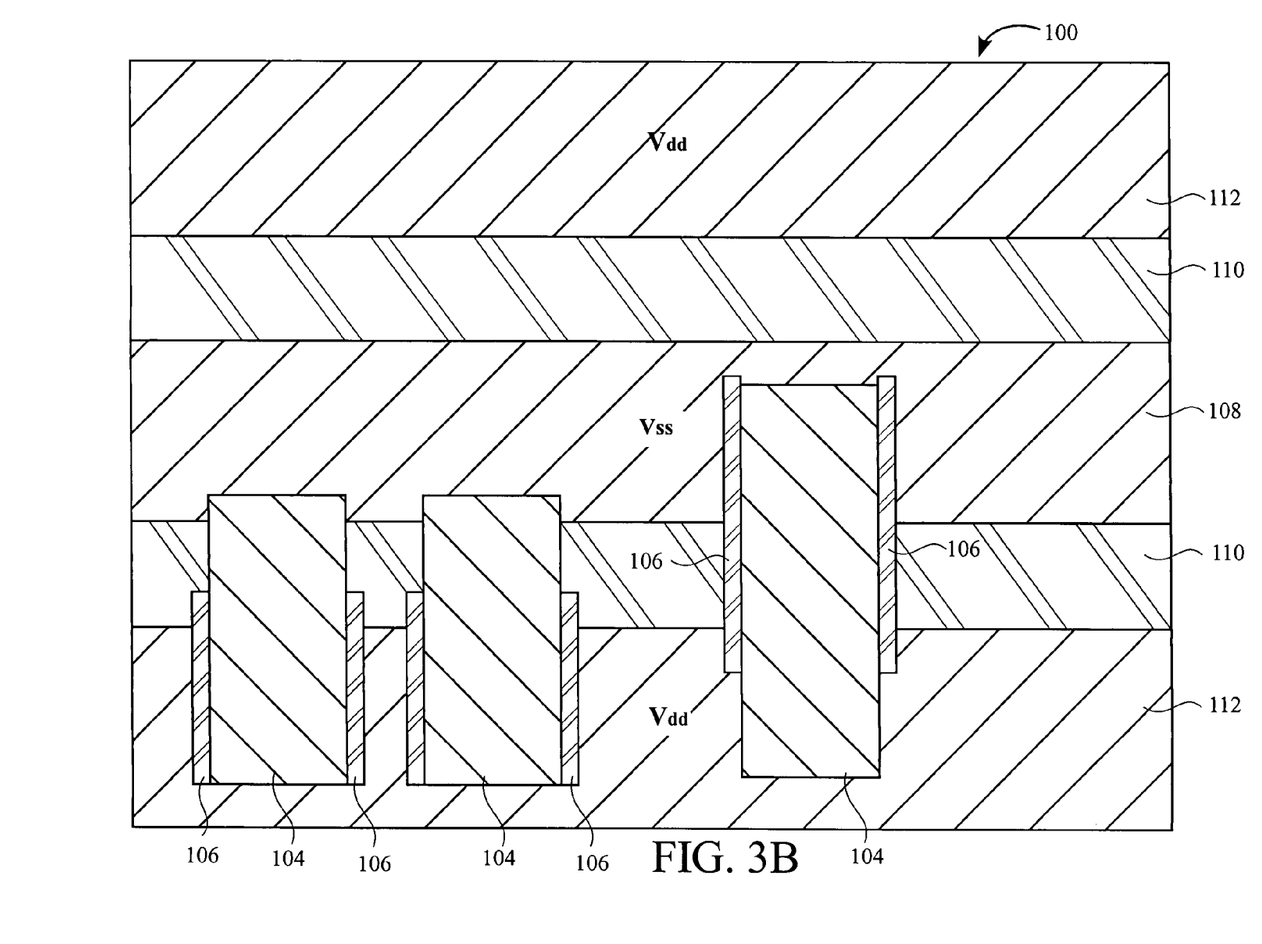
FIG. 3B illustrates a top view of a capacitor structure in accordance with one embodiment of the present invention.

FIG. 3B illustrates a top view of a capacitor structure 100 in accordance with one embodiment of the present invention. It should be appreciated that any suitable number of conductive layers 104 may be utilized in the semiconductor structure 100 to generate any suitable amount of capacitance.

In one embodiment, as shown in FIG. 3B, the power rail 108 is adjacent to the power rail 112 and are separated by the dielectric 110. From the top view, the conductive layer 104 extends in a perpendicular direction across the power rail 108 and the power rail 112. In the embodiment as shown in FIG. 3B, three of the conductive layers 104 are shown. The conductive layers 104 can be transport media for electrical charges from, in one embodiment, the power rail 108 to the power rail 112. In such an embodiment, the dielectric layer 106 is located between the conductive layers 104 and the power rail 112. In this manner, when electrical charge is applied to the power rail 108, the electrical charge is applied to the conductive layers 104. The conductive layer 104 are separated from the power rail 112 by the dielectric 106 which generates capacitance when an electrical charge is applied to the power rail 112. It should also be understood that the size of the conductive layer 104 may be any suitable size as long as the resistance level provided by the conductive layer 104 is at a desired level and as long as the conductive layer 104 does not make direct electrical contact with the power rail that has the dielectric layer 106.

Figure 3C:
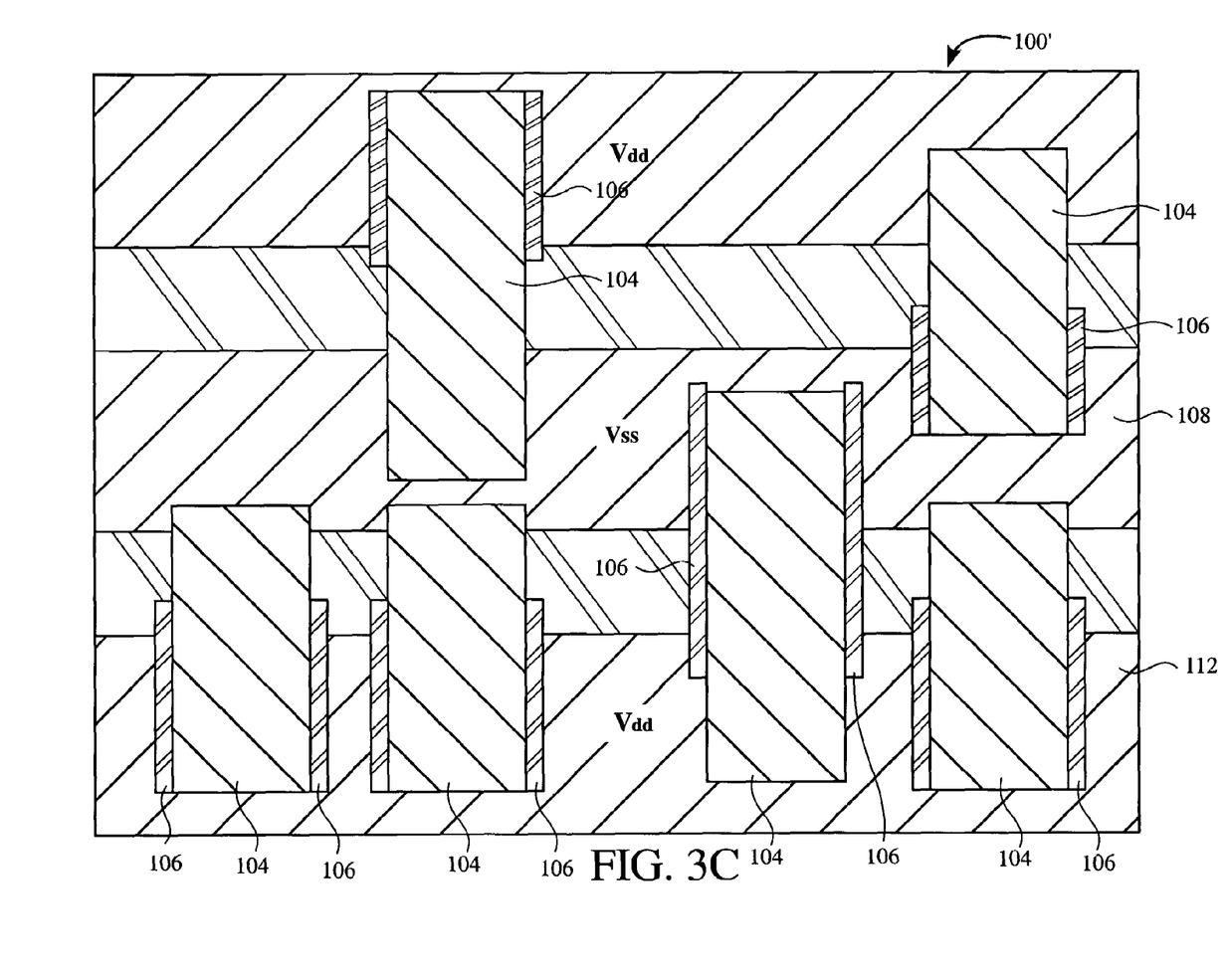
FIG. 3C shows a top view of an alternative capacitor structure in accordance with one embodiment of the present invention.

FIG. 3C shows a top view of an alternative capacitor structure 100' in accordance with one embodiment of the present invention. In this embodiment, the structure 100' includes 6 conductive layers 104 that are electrically connected to the power rail 108, but separated from the power rail 112 by the dielectric layer 106. Therefore, any suitable number of conductive layers 104 may be used to generate any suitable number of capacitors such as, for example, 1, 2, 3, 4, 5, 6, 7, 8, etc. as long as space on a top level of the semiconductor is available. It should be appreciated that in one embodiment, there may be an array of capacitor structure on the topmost level of the semiconductor device. Because, the conductive layers 104 may be located in a top layer of the capacitor structure 100', extra space that would typically be required for vias and lower level conductive layers are not required. Consequently, numerous capacitors can be incorporated into the semiconductor structure 100' without having to use dedicated space for the capacitors. In this fashion, space needed for other structures within a semiconductor wafer may be optimized.

Figure 4:
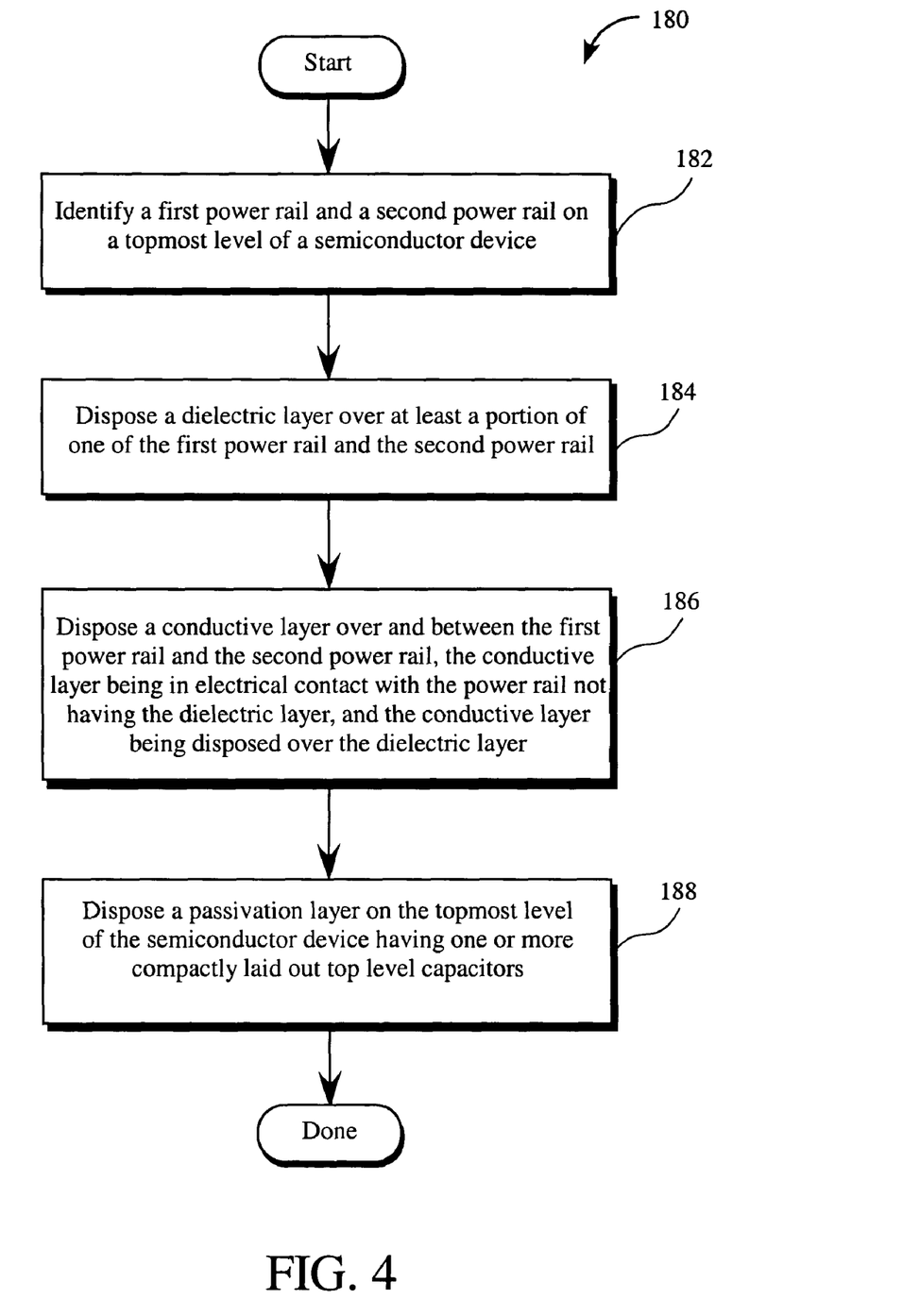
FIG. 4 illustrates a flowchart showing a process flow for generating a capacitor structure in accordance with one embodiment of the present invention.

FIG. 4 illustrates a flowchart 180 showing a process flow for generating a capacitor structure 100 in accordance with one embodiment of the present invention. It should be understood that the processes depicted in the flowchart 180 (as well as the other flowcharts described herein) may be in a program instruction form written on any type of computer readable media. For instance, the program instructions can be in the form of software code developed using any suitable type of programming language. It should be appreciated that the process described by flowchart 180 and the other flowcharts described herein are exemplary embodiments, and other embodiments with other suitable processes may be utilized as long as the desired capacitive structure may be generated.

Flowchart 180 begins with operation 182 which identifies a first power rail and a second power rail on a topmost level of a semiconductor device. In one embodiment the first power rail and the second power rail is a power (Vdd) and a ground (Vss).

After operation 182, the method moves to operation 184 which disposes a dielectric layer over at least a portion of one of the first power rail and the second power rail. In one embodiment, the dielectric layer is disposed over the power rail that is to be a bottom plate of the capacitor that is to be generated. The dielectric layer is applied so when the conductive layer is applied, the dielectric layer may prevent direct contact between the conductive layer and the power rail with the dielectric layer.

After operation, 184, the method advances to operation 186 which disposes a conductive layer over and between the first power rail and the second power rail, the conductive layer being in electrical contact with the power rail not having the dielectric layer, and the conductive layer being disposed over the dielectric layer. In one embodiment, the conductive layer is defined so the conductive layer may carry an electrical charge from the power rail without the dielectric layer to a region over the dielectric layer. Therefore, the conductive layer may serve as a top plate of the capacitor while the power rail with the dielectric layer may serve as a bottom plate of the capacitor with the dielectric layer serving as the dielectric of the capacitor. In such a configuration, when an electrical charge is applied in both the power rails, capacitance may be generated.

Then the method proceeds to operation 188 which disposes a passivation layer on the topmost level of the semiconductor device having one or more compactly laid out top level capacitors. The passivation layer may serve to protect the topmost level of the semiconductor device. In another embodiment, the passivation layer may be disposed on the semiconductor device having an array of top level capacitors to define a desired capacitance value.

Figure 5:
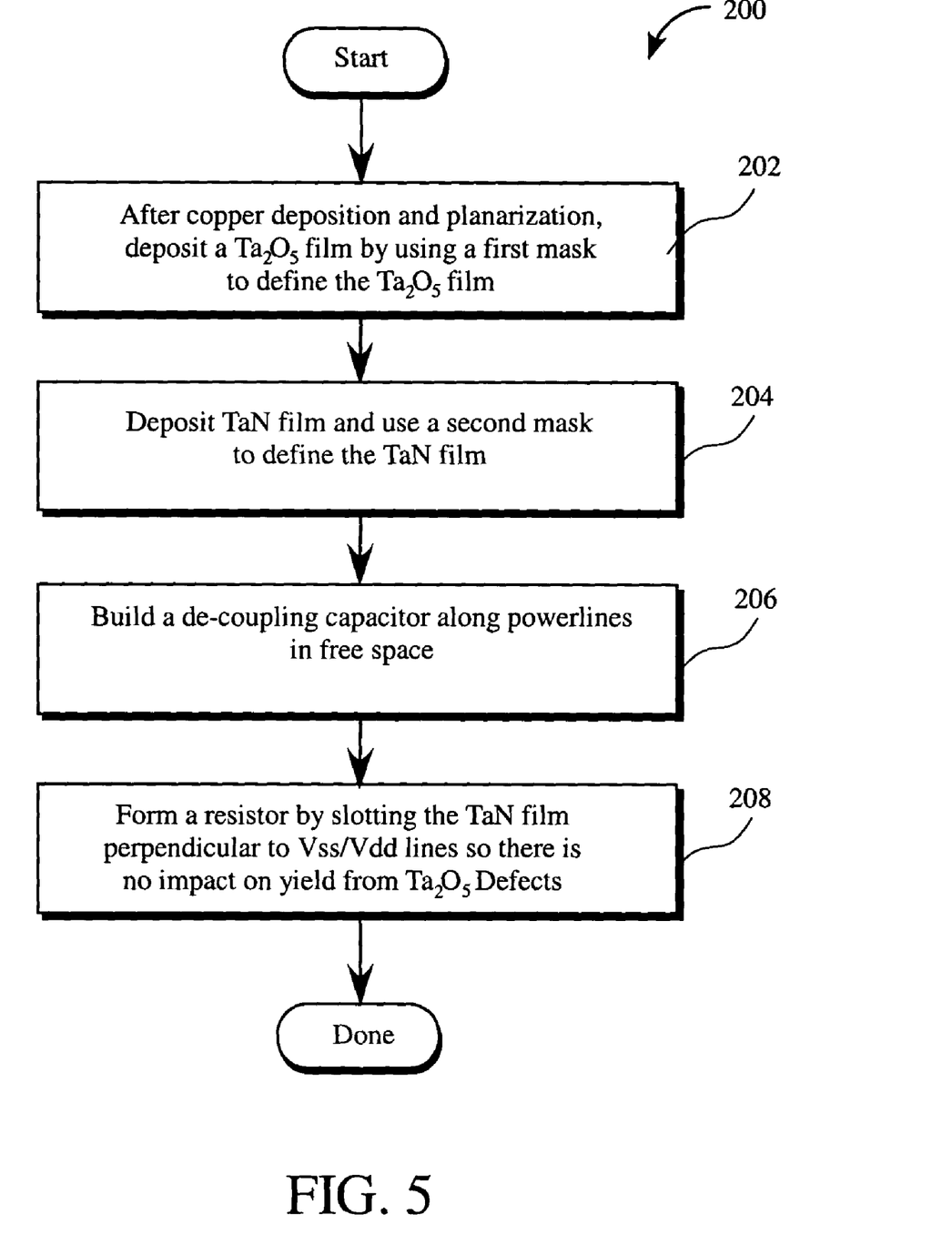
FIG. 5 shows a flowchart illustrating another process flow for generating a capacitor in accordance with on embodiment of the present invention.

FIG. 5 shows a flowchart 200 illustrating another process flow for generating a capacitor in accordance with on embodiment of the present invention. In this embodiment, the method begins with operation 202 where after copper deposition and planarization, a $Ta_2O_5$ film is deposited using one mask to define the $Ta_2O_5$ film. It should be appreciated that typical semiconductor processing techniques such as photolithography, etching, and film deposition processes as known by those skilled in the art may be utilized to accomplish the processes described in reference to the flowchart 200.

In one embodiment of operation 202, after copper lines utilized for the Vss and the Vdd (e.g., the power rail 108 and the power rail 112 respectively) are laid down on the semiconductor, the dielectric 106 is deposited on the copper to provide insulation between the Vdd and the conductive layer 104. It should be appreciated that other materials besides copper, such as TaN, may be disposed below the dielectric 106 if other types of conductive materials are desired to be used besides copper. In one embodiment, the $Ta_2O_5$ film is the dielectric 106 as discussed above in reference to FIGS. 2A through 2C. It should be appreciated that although the $Ta_2O_5$ film is utilized in this embodiment, other embodiments may be utilized with other types of materials capable to be used as an insulator such as, for example, silicon oxide, $Si_3N_4$, and other high-K dielectrics.

After operation 202, the method moves to operation 204 where a TaN film is deposited and a second mask is used to define the TaN film. In this operation the TaN film is the conductive layer 104 as discussed above in reference to FIGS. 2A through 2C. It should be appreciated that although the TaN film is utilized in this embodiment, other embodiments may be utilized with other types of materials capable to be used as the conductive layer 104 such as, for example, TiN, Al, In, etc.

In one embodiment, as shown above in reference to FIG. 2A, the conductive layer is disposed over a portion of the Vss and extends to a region over the dielectric 106 where the dielectric layer 106 is located in between the Vdd and the conductive layer 104. In this manner, capacitance may be generated without needing dedicated space on the semiconductor.

After operation 204, the method advances to operation 206 where a de-coupling capacitor is built along the powerlines in free space. In this operation, the de-coupling capacitor (e.g., the conductive layer connected with Vss extending over the dielectric layer 106 to generate capacitance) may be generated in free space of the semiconductor (e.g., the topmost level of the semiconductor device) to conserve needed space on the semiconductor that could be utilized for other structures.

Following operation 206, the method proceeds to operation 208 where a resistor is formed by slotting the TaN perpendicular to Vss/Vdd lines so there is no impact on yield from $Ta_2O_5$ defects. By this operation, a structure such as one described above in reference to FIG. 2A is generated. In one embodiment, a material with resistance properties such as, for example, TaN may be utilized. In such an embodiment, if $Ta_2O_5$ defects such as a hole in the dielectric layer 106 exists, the resistor formed by the TaN (e.g., the current limiter as described in reference to FIG. 2B reduces or prevents current leakage thereby protecting the semiconductor device.

Figure 6:
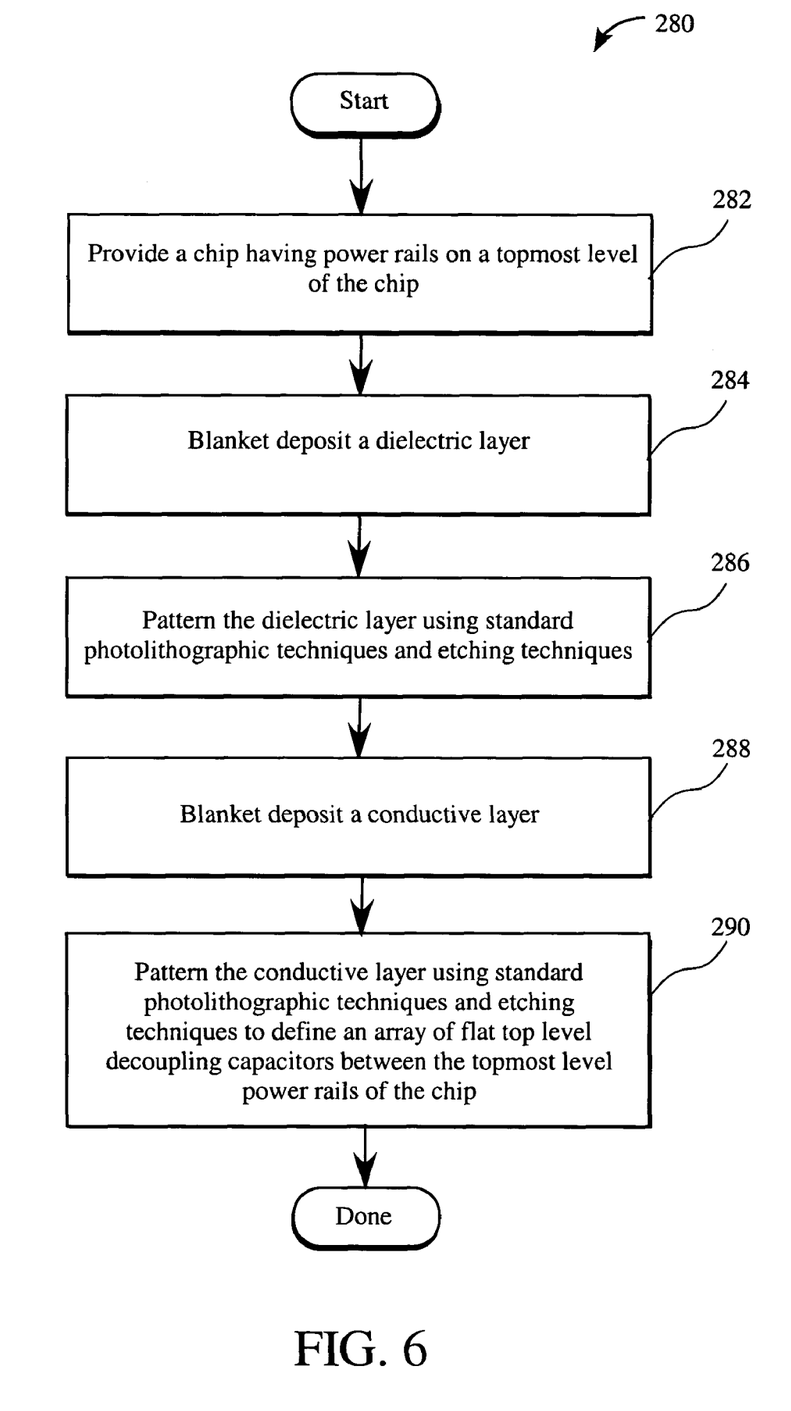
FIG. 6 illustrates a flowchart that shows yet another method for generating a capacitor structure in accordance with one embodiment of the present invention.

FIG. 6 illustrates a flowchart 280 that shows yet another method for generating a capacitor structure 100 in accordance with one embodiment of the present invention. The method begins with operation 282 which provides a chip having top most power rails.

After operation 282, the proceeds to operation 284 where a dielectric layer is blanket deposited. Then the method moves to operation 286 which patterns the dielectric layer using standard photolithography techniques and etching techniques. In one embodiment, the dielectric layer is patterned so the dielectric layer is disposed at least partially over one of the power lines. After operation 286, the method advances to operation 288 where a conductive layer is blanket deposited. Then the method ends with operation 290 where a conductive layer is patterned using standard lithographic and etching techniques to define an array of flat top level decoupling capacitors between the topmost level power rails of the chip. In one embodiment, the conductive layer is patterned such that a conductive layer is disposed over and between the first power rail and the second power rail. In one embodiment, the conductive layer is in electrical contact with the power rail not having the dielectric layer, and the conductive layer is disposed over the dielectric layer. In one embodiment, the conductive layer is defined so the conductive layer may carry an electrical charge from the power rail without the dielectric layer to a region over the dielectric layer. In this way when a charge is applied to the power layer with the dielectric layer, capacitance may be generated.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data which can be thereafter be read by a computer system. Examples of the computer readable medium include read-only memory, random-access memory, CD-ROMs, CD-Rs, CD-RWs, magnetic tapes, and other optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A capacitor structure in a semiconductor device, comprising:
   a first power rail on a topmost level of the semiconductor device;
   a second power rail on the topmost level of the semiconductor device;
   a dielectric layer disposed over at least a portion of either the first power rail or the second power rail; and
   a conductive layer defined over and between the first power rail and the second power rail, the conductive layer being defined in direct physical contact with the power rail not having the dielectric layer disposed thereon and in direct physical contact with the dielectric layer, wherein the direct physical contact between the conductive layer and the power rail not having the dielectric layer is defined without conductive vias.

2. A capacitor structure as recited in claim 1, wherein the conductive layer is a TaN material.

3. A capacitor structure as recited in claim 1, wherein the first power rail is a ground (Vss) and the second power rail is a power (Vdd).

4. A capacitor structure as recited in claim 1, wherein the first power rail and the second power rail are separated by a dielectric.

5. A capacitor structure as recited in claim 1, wherein a passivation layer is disposed over the topmost level of the semiconductor device.

6. A capacitor structure as recited in claim 1, wherein the dielectric layer is disposed over one of the first power rail and the second power rail to prevent the conductive layer from contacting the power rail with the dielectric layer.

7. A capacitor structure as recited in claim 1, wherein the conductive layer is defined in a perpendicular orientation across the first power rail and the second power rail.

8. A capacitor structure as recited in claim 1, wherein the capacitor structure is substantially flat and occupies a topmost level of the semiconductor device.

9. A capacitor structure in a semiconductor device, comprising:
   a first power rail on a topmost level of the semiconductor device;
   a second power rail on the topmost level of the semiconductor device;
   a dielectric layer disposed over at least a portion the first power rail; and
   a conductive layer defined over and between the first power rail and the second power rail, the conductive layer being defined as a physical layer that is in contact with the second power rail without conductive vias and is in contact with the dielectric layer, a capacitive connection being defined between the conductive layer and the first power rail.

10. A capacitor structure in a semiconductor device as recited in claim 9, wherein a connection defined between second power rail and the dielectric layer defines a resistance that is in series with the capacitive connection.

* * * * *